(12) United States Patent
Lee et al.

(10) Patent No.: US 6,849,505 B2
(45) Date of Patent: Feb. 1, 2005

(54) SEMICONDUCTOR DEVICE AND METHOD FOR FABRICATING THE SAME

(75) Inventors: Kee-Jeung Lee, Ichon (KR); Jong-Hyuk Oh, Ichon (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/241,661

(22) Filed: Sep. 12, 2002

(65) Prior Publication Data

US 2003/0052374 A1 Mar. 20, 2003

(30) Foreign Application Priority Data

Sep. 14, 2001 (KR) .......................................... 2001-56830

(51) Int. Cl.[7] .......................................... H01L 21/8247
(52) U.S. Cl. ...................................... 438/261; 438/785
(58) Field of Search ............................... 438/257–267, 438/785, 287, 240, 763

(56) References Cited

U.S. PATENT DOCUMENTS

| | | | |
|---|---|---|---|
| 6,011,284 A | | 1/2000 | Katori et al. |
| 6,168,991 B1 | | 1/2001 | Choi et al. |
| 6,177,284 B1 | | 1/2001 | Horii et al. |
| 6,207,489 B1 | | 3/2001 | Nam et al. |
| 6,309,927 B1 | * | 10/2001 | Au et al. ..................... 438/261 |
| 6,534,395 B2 | * | 3/2003 | Werkhoven et al. ......... 438/627 |
| 2001/0015456 A1 | * | 8/2001 | Bui ............................. 257/324 |
| 2001/0044187 A1 | * | 11/2001 | Joo et al. .................... 438/264 |
| 2003/0071304 A1 | * | 4/2003 | Ogle et al. .................. 257/324 |

FOREIGN PATENT DOCUMENTS

| | | | |
|---|---|---|---|
| JP | 2001-036045 | | 2/2001 |
| JP | 2001-057414 | | 2/2001 |
| JP | 2001210734 | * | 8/2001 |
| KR | 2000-0027836 | | 5/2000 |
| KR | 2000-0041370 | | 7/2000 |
| KR | 2001066386 A | * | 7/2001 |
| KR | 2001-0063468 | | 7/2001 |

OTHER PUBLICATIONS

Wolf et al., "Silicon Processing for the VLSI Era vol. 1: Process Technology", pp. 516–521, 532–533, 1986, Lattice Press.*
Notice of Preliminary Rejection from the Korean Intellectual Property Office, dated May 26, 2003, 2 pages, with English translation (1 page).
English abstract for KR 2000–0027836, 2 pages.
English abstract for KR 2001–0063468, 2 pages.
English abstract for KR 2000–0041370, 2 pages.
U.S. patent application Publication No. 2001/0013629 A1, published Aug. 16, 2001.

* cited by examiner

Primary Examiner—Richard A. Booth
(74) Attorney, Agent, or Firm—Finnegan, Henderson, Farabow, Garrett & Dunner, L.L.P.

(57) ABSTRACT

Disclosed is a semiconductor device having a double dielectric layer, wherein the double dielectric layer comprises a first dielectric layer having aluminum and a second dielectric layer, of which a dielectric constant is higher than that of the first dielectric layer, stacked on the first dielectric layer. Also disclosed are methods for fabricating the semiconductor device.

15 Claims, 6 Drawing Sheets

SEMICONDUCTOR DEVICE AND METHOD FOR FABRICATING THE SAME

FIELD OF THE INVENTION

The present invention relates to semiconductor devices and methods for making the same; and, more particularly, to semiconductor devices having a dielectric layer of a stacked structure and methods for their fabrication.

DESCRIPTION OF THE PRIOR ART

Generally, a $SiO_2$ layer, which is grown by a rapid thermal treatment process, has been used as gate oxide layers in DRAM or logic device in semiconductor devices. As a design rule, the size of a semiconductor device has been decreased to a tunneling effective thickness (Teff) of 25 Å to 30 Å, which is the tunneling limitation of the $SiO_2$ layer. An appropriate thickness of the $SiO_2$ layer is about 25 Å to 30 Å in a semiconductor device of a 0.1 μm size. However, since off-current increases from direct tunneling, operation of the semiconductor device is deteriorated. Thus, it is beneficial to reduce current leakage in memory devices.

To solve this problem, high-k dielectric materials have been researched for use in gate oxide layers. Such materials include $Ta_2O_5$, which is used for capacitor storage, $TiO_2$, $Al_2O_3$, $HFO_2$, and the like.

Recently, integration of memory devices has rapidly accelerated due to development of fine semiconductor processing technologies. As a result, the area of a unit cell in the semiconductor device has been greatly reduced and lower power is required to operate the device. However, the capacitance necessary for operation of such memory devices is required to be over 25 fF/cell to protect against soft errors and to reduce refresh time as the area of a cell is reduced.

Accordingly, when a nitride layer having a NO (Nitride/Oxide) structure is used as a dielectric layer in a capacitor, a storage electrode having a hemispherical structure of a 3-dimensional type, which has a large surface area, is usually used This causes the height to gradually increase. When the height of a capacitor increases, the desired focusing depth cannot be obtained by post exposing processes due to a difference in height between a cell of the capacitor and adjacent circuits. This causes a bad effect on an integration process. As mentioned the above, a capacitor using a NO layer as a dielectric layer can not be applied to a next generation memory device of over a 256 Mb memory device because it is difficult to obtain desired capacitance.

Highly integrated semiconductor devices require high-k dielectric materials, such as $Ta_2O_5$, $TiO_2$, $TiO_2$, $SrTiO_3$, (Ba, Sr)TiO or the like. Such materials have been developed to replace $SiO_2$, $Si_3N4$ or NO as dielectric materials. Specially, the capacitance (ϵ) of a layer comprising $Ta_2O_5$, which ϵ is about 25 to 27, is much higher than that of a NO layer, which ϵ is about 4 to 5. Therefore, the $Ta_2O_5$ layer is eligible for the dielectric layer in the capacitor.

FIG. 1 is a cross-sectional view showing a capacitor according to the prior art.

Referring to FIG. 1, a first electrode 11, which is a bottom electrode of a capacitor, is formed with a doped polysilicon layer and a dielectric layer 12 having a stacked structure, such as a $SiO_2/Ta_2O_5$ layer or a $SiO_2/Ta_2O_5$ layer, is formed on the first electrode 11. Sequentially, a second electrode 13, which is a top electrode of a capacitor, is formed with a polysilicon layer on the dielectric layer 12. Also, the dielectric layer 12 may be formed with a $SiO_xN_y/Si_3N_4$ layer or a $SiO_xN_y/Ta_2O_5$ instead of the $SiO_2$ layer.

The first and second electrodes 11 and 13 are formed with a doped polysilicon layer or a doped amorphous silicon layer. Also, the first and second electrodes 11 and 13 can be formed with metal materials, such as TiN, TaN, W, WN, WSi, Ru, $RuO_2$, Ir, $IrO_2$, Pt or the like. However, when a simply stacked structure is used in a capacitor, there is a limitation to increase capacitance.

FIG. 2 is a cross-sectional view showing another capacitor according to the prior art.

Referring to FIG. 2, a first electrode 11, which is a bottom electrode of a capacitor, is formed with a polysilicon layer on a semiconductor substrate 10 and a dielectric layer 12 is formed to a stacked structure, such as a $SiO_2/Si_3N_4$ layer or a $SiO_2/Ta_2O_5$ layer, on the first electrode 11. Subsequently, a second electrode 13, which is a top electrode of a capacitor, is formed by a doped polysilicon layer on the dielectric layer 12. The first and second electrodes 11 and 13 are formed with a doped polysilicon layer or a doped amorphous silicon layer. Also, the first and second electrodes 11 and 13 can be formed with metal materials, such as TiN, TaN, W, WN, WSi, Ru, $RuO_2$, Ir, $IrO_2$, Pt or the like.

Also, the first electrode can be formed to various 3-D structures based on a cylinder structure according to the prior art. As a polysilicon layer 11A having hemispherical grains is employed, a surface area of the first electrode increases.

The reference numeral '10' denoted in FIG. 2 represents a source/drain of a transistor or an interconnection layer including a plug to be connected the source/drain.

However, there is a limitation on having sufficient capacitance of the $SiO_2/Si_3N_4$ (or $SiO_xN_y/Si_3N_4$) layer.

Since a $Ta_2O_5$ layer has an unstable stoichiometry, substitute tantalum atoms occupy oxygen vacancies due to a difference in composition ratio between tantalum, and oxygen locally remains in the layer. The oxygen vacancies can not be removed. In addition, since the $Ta_2O_5$ layer has high oxidation reactivity with a polysilicon layer or a TiN layer, which is used as top/bottom electrodes, oxygen atoms are moved to the surface of the layer so that a low-k dielectric layer is formed to prevent the uniformity of its boundary from deteriorating.

Impurities, such as carbon atoms, carbon compounds, $H_2O$ or the like, which are generated by an reaction between a precursor $Ta(OC_2H_5)_2$ of the tantalum oxide layer and organics, remain in the layer. A current leakage of the capacitor increases due to impurities, such as the carbon atoms, ions, radicals and the like, and the dielectric characteristics are deteriorated.

Accordingly, a thermal treatment process is required at a low temperature to remove the impurities. However, this requires undesirable complex processing.

SUMMARY OF THE INVENTION

The present invention provides a semiconductor device having a dielectric layer having sufficient capacitance required in high integration semiconductor devices and which protects against increases in current leakage and deterioration of dielectric characteristics due to impurities remaining in the dielectric layer.

The present invention also provides a semiconductor device having a double dielectric layer, wherein the double dielectric layer comprises: a first dielectric layer having aluminum; and a second dielectric layer, of which a dielectric constant is higher than that of the first dielectric layer, stacked on the first dielectric layer.

In accordance with another aspect of the present invention, there is provided a semiconductor device comprising: a semiconductor substrate; a first gate electrode on the semiconductor substrate; a first gate insulating layer having aluminum on the first gate electrode; a second gate insulating layer, of which a dielectric constant is higher than that of the first gate insulating layer, stacked on the first insulating layer; and a second gate electrode on the second gate insulating layer.

The present invention also provides a method for fabricating a semiconductor device comprising the steps of: a) providing a semiconductor substrate; b) forming a first gate electrode on the semiconductor substrate; c) forming a first gate insulating layer having aluminum on a semiconductor substrate; d) forming a second gate insulating layer, of which a dielectric constant is higher than that of the first gate insulating layer, on the first gate insulting layer; and e) forming a second gate electrode on the second gate insulating layer.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE PREFERRED EMBODIMENTS

Hereinafter, a semiconductor device having a stacked dielectric layer in the capacitor according to the present invention will be described in detail referring to the accompanying drawings. All temperatures used herein are approximate, and expressed in units of degrees Centigrade (° C.).

Figure 1:
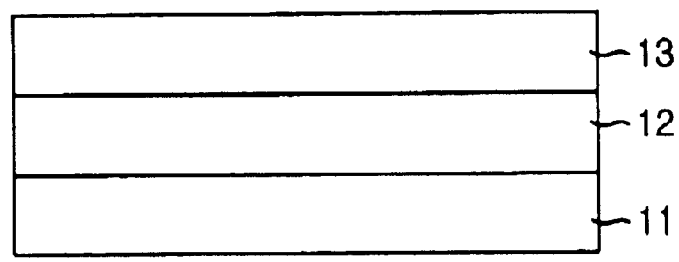
FIG. 1 is a cross-sectional view showing a stacked-type capacitor according to the prior art.
Figure 2:
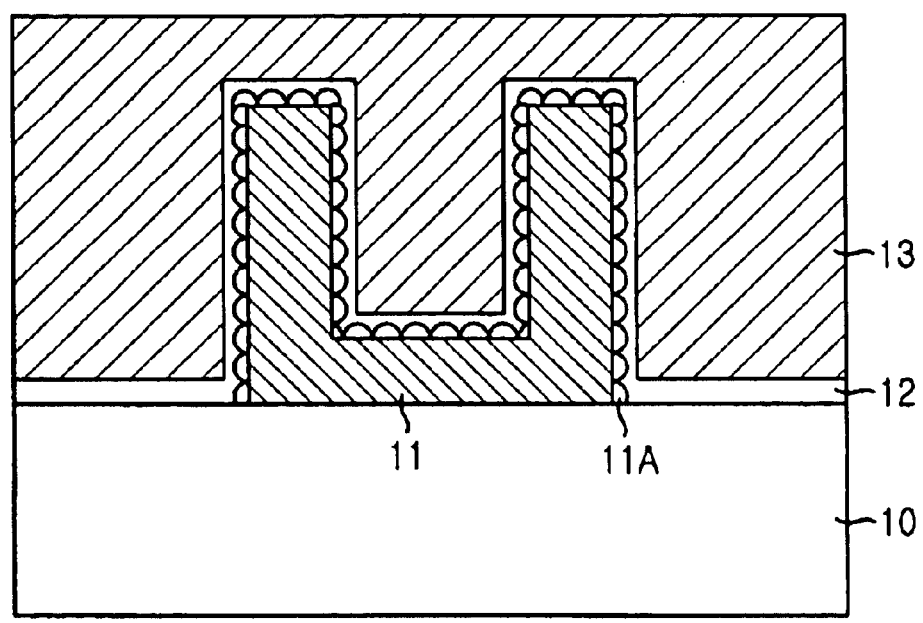
FIG. 2 is a cross-sectional view showing a cylinder-type capacitor according to the prior art.
Figure 3:
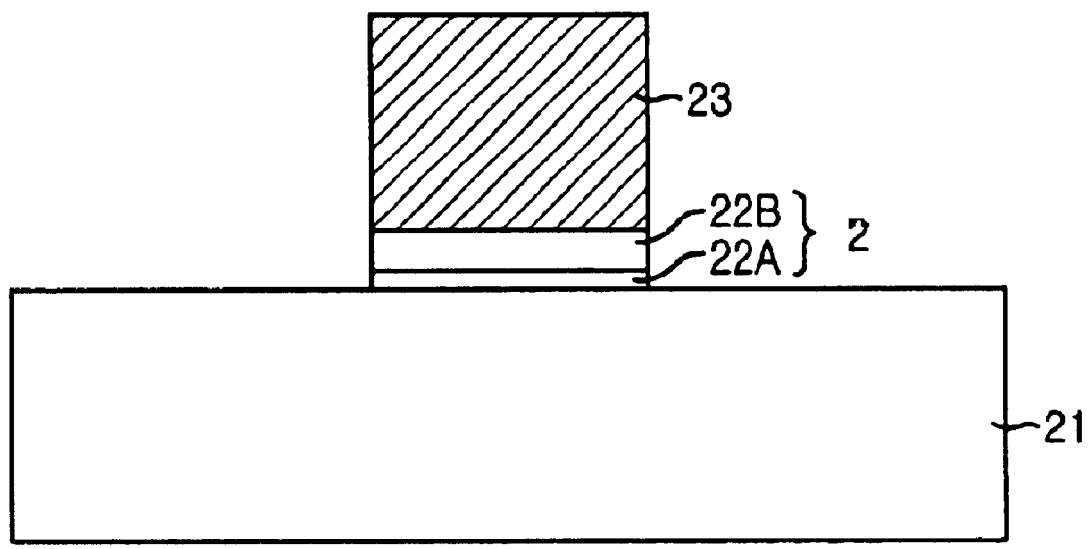
FIG. 3 is a cross-sectional view showing a semiconductor device having an $Al_2O_3$/TaON layer as a dielectric layer according to the present invention.

FIG. 3 is a cross-sectional view showing a semiconductor device according to the present invention.

Referring to FIG. 3, the semiconductor includes a semiconductor substrate 21 comprising silicon, a gate oxide layer 22, in which a first gate oxide layer 22A having aluminum, a second gate oxide layer 22B having a high dielectric constant are stacked, and a gate electrode 23 formed on the gate oxide layer 22.

The first gate oxide layer 22A is an $Al_2O_3$ layer, of which a dielectric constant is 7, having a perovskite structure and covalent bonding. The second gate oxide layer 22B is formed with a TaON layer, having a dielectric constant of 23 to 25, a $Ta_2O_5$ layer, having a dielectric constant of 25 to 27, a BST ($(Ba, Sr)TiO_3$)) layer, having a dielectric constant of 200 to 400.

The thickness of the first gate oxide layer 22A is thinner than that of the second gate oxide layer 22B. The first gate oxide layer 22A is formed at a thickness of 10 Å to 20 Å and the second gate oxide layer 22B is formed at a thickness of 50 Å to 100 Å. The first gate oxide layer 22A is an oxygen diffusion barrier layer which prevents oxygen diffusion from the second gate oxide layer 22B into the semiconductor substrate 21 and formation of a low-k dielectric layer on the surface of the semiconductor substrate 21.

The semiconductor substrate 21 is a normal semiconductor substrate having silicon and a gate electrode 23. This substrate is formed with a material selected from a group consisting of a silicon material including a doped polysilicon and doped amorphous silicon, a metal material including TiN, TaN, W, WN, Ru, Rr or Pt, a metal oxide material including $RuO_2$ or $IrO_2$, and a silicide material including WSi, which are used as a material of a gate electrode of a transistor.

When the gate electrode 23 is formed with a TiN layer, a doped polysilicon layer can be deposited as a buffer layer to improve durability of the TiN layer against a thermal or electrical impact and obtain structural stability.

A nitride layer may be formed between the first gate electrode 22A and the semiconductor substrate 21 to suppress the formation of a low-k dielectric layer.

Figure 4:
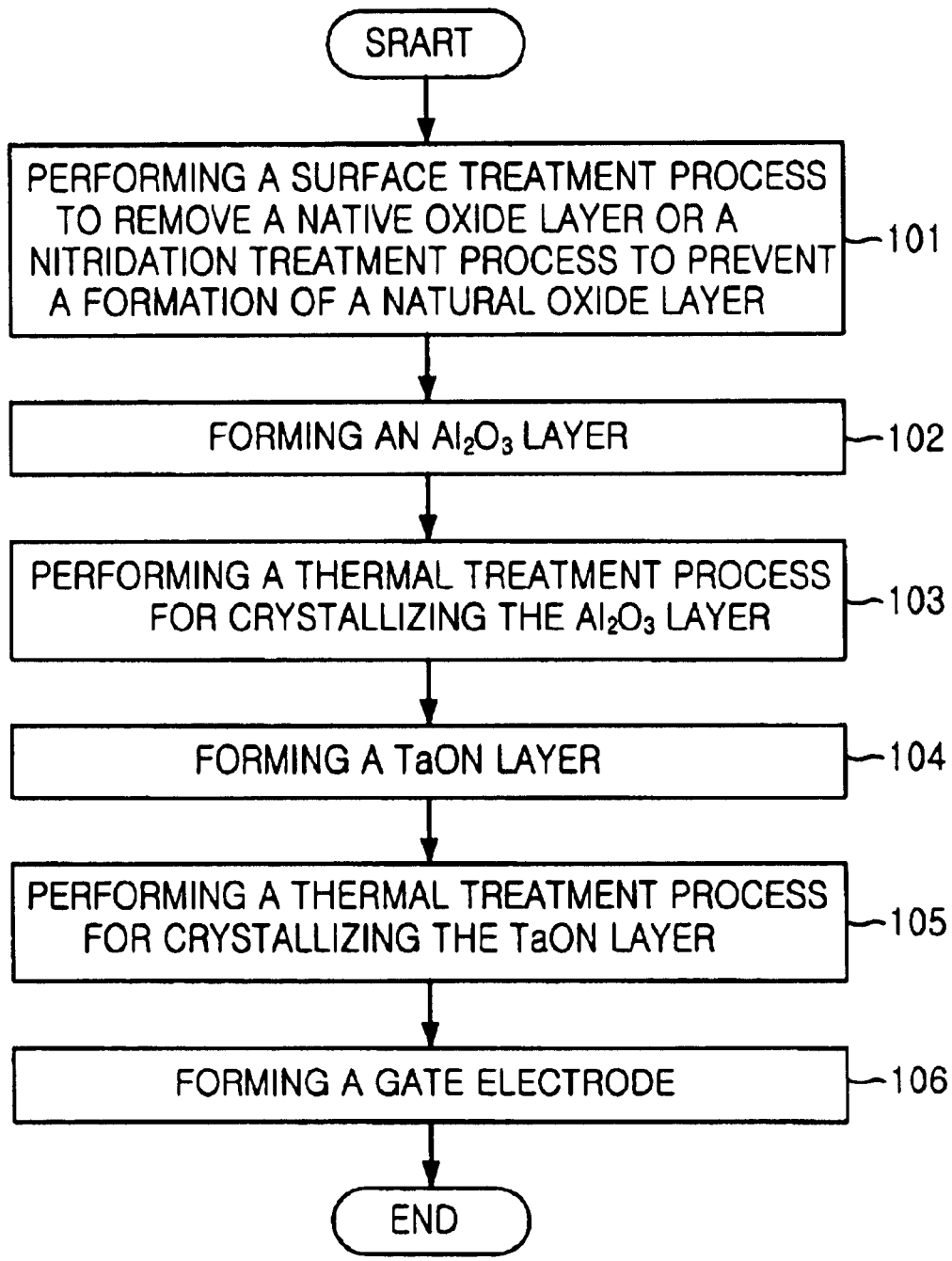
FIG. 4 is a flow chart showing a method for fabricating the semiconductor device in FIG. 3 according to the present invention.

FIG. 4 is a flow chart showing a method for fabricating the semiconductor device in FIG. 3.

Referring to FIG. 4, a surface treatment process is carried out to remove a native oxide ($SiO_2$) layer which was generated on the surface of the semiconductor substrate 21, or nitridation process is carried out to prevent generation of a native oxide layer and to minimize formation of a low-k dielectric layer generated in a post $Al_2O_3$ layer deposition process at a step 101.

The surface treatment process is carried out in-situ or ex-situ by using a HF gas, a HF solution or the like. Before or after the HF surface treatment process in the surface treatment process of the doped polysilicon substrate, a cleaning process is carried out, or a surface treatment using a $NH_4OH$ solution or a $H_2SO4$ solution is carried out, to improve uniformity of the surface thereof.

The nitridation process is carried out in-situ or ex-situ by a plasma discharge in an atmosphere of a $NH_3$ gas or a $N_2/H_2$ gas at a low pressure chemical vapor deposition (LPCVD) chamber. At this time, a wafer is maintained at a temperature of about 300° C. to about 500° C.

Another nitridation process is carried out in-situ or ex-situ by a rapid thermal nitridation process using a rapid thermal process at a temperature of about 750° C. to about 950° C. and in an atmosphere of a $NH_3$ gas for about 30 seconds to about 120 seconds. Also, the nitridation process can be carried out by using an electro-furnace process at a temperature of about 500° C. to about 1000° C. and in an atmosphere of a $NH_3$ gas.

A first gate oxide layer 22A is formed on the semiconductor substrate 21, on which the surface treatment process or the nitridation process is completed, at a thickness of 10 Å to 20 Å with an $Al_2O_3$ layer. A chemical vapor having aluminum is introduced into an evaporator or an evaporation tube through a flow controller, such as a MFC, and an oxygen ($O_2$) gas is added and then the mixed gas is liquefied into an $Al(OC_2H_5)_3$ solution. The $Al(OC_2H_5)_3$ solution is evaporated at a temperature of about 150° C. to about 300° C. so that $Al_2O_3$ is obtained.

A thermal treatment is carried out by using an in-situ plasma in an ambient atmosphere of a $NO_2$ gas or a $O_2$ gas and at a temperature of about 200° C. to about 600° C. to remove structural defects due to dangling bonds and to improve structural non-homogeneity so that current leakage is reduced.

After depositing a TaON layer, a crystallization process of the $Al_2O_3$ layer to act as a diffusion barrier layer is carried out at a temperature of about 800° C. to about 950° C. and in an atmosphere of a $N_2$ gas or a $N_2/O_2$ gas in a rapid thermal process device to protect an oxygen diffusion into a polysilicon layer at a step 103.

Also, the crystallization process of the $Al_2O_3$ layer can be carried out by using an electro-furnace at a temperature of about 700° C. to about 800° C. and in an atmosphere of a $N_2O$ gas, a $N_2$ gas or $N_2/O_2$ gas for 10 minutes to 30 minutes.

A second gate oxide layer 22B is formed on the crystallized $Al_2O_3$ layer with a TaON layer at a step 104. The TaON layer is deposited in a low pressure chemical vapor deposition (LPCVD) chamber. A Ta bearing vapor gas and a $NH_3$ gas, which is a reaction gas at a pressure of 10 sccm to 100 sccm, or a $O_2$ gas, which is a reaction gas at a pressure of 0 sccm to 300 sccm, are provided on the surface of a wafer through a mass flow controller (MFC) and then an amorphous TaON layer is formed by an surface reaction at a thickness of 50 Å to 100 Å. Subsequently, a thermal treatment process is carried out at a high temperature to crystallize the TaON layer at a step 104.

The Ta bearing vapor gas is generated by evaporating organic metal compound having $Ta(OC_2H_5)_5$ or $Ta(N(CH_3)_2)_5$ of over 99.999% provided through a MFC in the evaporator or the evaporation tube maintained at a temperature of about 150° C. to about 200° C. To protect from condensation of the vapor gas, the temperature is maintained at about 150° C. to about 200° C. and the pressure is maintained at 0.1 torr to 5 torr and then the vapor gas is injected into a LPCVD chamber.

The thermal treatment process for crystallizing an amorphous TaON layer is carried out in the rapid thermal process device at a temperature of about 800° C. to about 950° C. and in an atmosphere of $N_2O$ gas, $N_2$ gas, or $N_2/O_2$ gas for 30 seconds to 120 seconds. As amorphous TaON layers crystallize, capacitance increases. At this time, impurities remaining in the TaON layer, such as CO, $CO_2$, $H_2O$, $CH_4$, $C_2H_4$ or the like, are removed.

Also, the thermal treatment process for crystallizing the amorphous TaON layer can be carried out in the electro-furnace at a temperature of about 700° C. to about 800° C. and in an atmosphere of $N_2O$ gas, $N_2$ gas, or $N_2/O_2$ gas for 10 minutes to 30 minutes.

To deposit the TaON layer or the $Al_2O_3$ layer, an atomic layer deposition (ALD) technique can be used instead of the LPCVD technique.

A gate electrode 23 is formed on the TaON layer. The gate electrode 23 can be formed by using a LPCVD technique, a plasma enhanced CVD (PECVD) technique or a RF-magnetic sputtering (RF-MS) technique.

As the $Al_2O_3$ layer is formed on the semiconductor substrate, diffusion of the TaON layer, having a high dielectric constant, is protected by a $SiO_2$ layer having a low dielectric constant in the first embodiment of the present invention.

Since the $Al_2O_3$ layer has a perovskite structure, high breakdown voltage is expected due to a high mechanical strength and, since the TaON layer has a high dielectric constant, a sufficient capacitance can be obtained.

Figure 5:
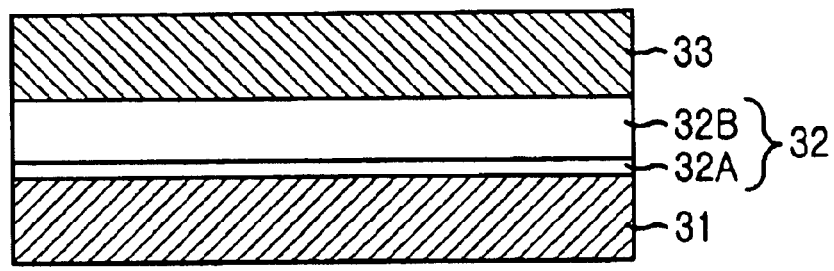
FIG. 5 is a cross-sectional view showing a capacitor having a stacked $Al_2O_3$/TaON layer in the semiconductor device according to the present invention.

FIG. 5 is a cross-sectional view showing a first example of a stacked capacitor according to a second embodiment of the present invention.

Referring to FIG. 5, a first electrode 31, a dielectric layer 32 and a second electrode 33 are sequentially formed. The dielectric layer is formed to a stacked layer having a first dielectric layer 32A having a covalent bonding and a second dielectric layer having a high dielectric constant.

The first dielectric layer 32A is formed to an $Al_2O_3$ layer, which has a dielectric constant of 7, a perovskite structure and a covalent bonding. The second dielectric layer 32B is formed with a layer selected form a group consisting of a TaON layer, which has a dielectric constant of 23 to 25, a $Ta_2O_5$ layer, which has a dielectric constant of 25 to 27, and a BST layer, which has a dielectric constant is of 200 to 400.

A thickness of the first dielectric layer 22A is thinner than that of the second dielectric layer 22B. The first dielectric layer 22A is formed at a thickness of 10 Å to 20 Å and the second dielectric layer 22B is formed at a thickness of 50 Å to 100 Å.

The first electrode 21, which is a bottom electrode, and the second electrode 23, which is a top electrode, are formed with a silicon layer having at least a doped polysilicon layer or a doped amorphous silicon layer, a metal layer having at least TiN, TaN, W, WN, Ru, Ir or Pt or a silicide layer having at least CoSi, MoSi or WSi.

When a TiN layer is formed as the second electrode 23, a doped polysilicon layer can be formed as a buffer layer to improve a resistance of the TiN layer against an electrical and thermal impacts.

Figure 6:
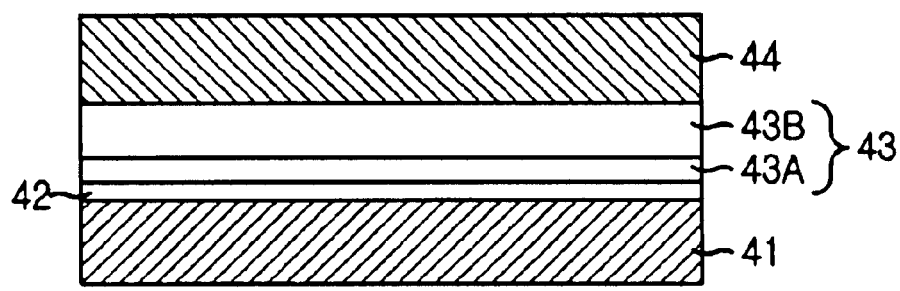
FIG. 6 is a cross-sectional view showing another capacitor having a stacked $Al_2O_3$/TaON layer in the semiconductor device according to the present invention.

FIG. 6 is a cross-sectional view showing a second example of a stacked capacitor according to the second embodiment of the present invention.

Referring to FIG. 6, a first electrode 41, a dielectric layer 43, and a second electrode 44, are sequentially formed. The dielectric layer 43 is formed to a stacked layer having a first dielectric layer 43A having covalent bonding and a second dielectric layer 43B having a high dielectric constant. A nitride layer 42 is formed by a nitridation process of a boundary between the first electrode 44 and the dielectric layer 43.

The nitride layer 42 prevents formation of a native oxide layer on the surface of the first electrode 41 and plays the role of an oxygen diffusion barrier layer by minimizing formation of a low-k dielectric oxide layer at a boundary between the first electrode 41 and the dielectric layer 43 in a deposition process of the dielectric layer 42. The nitride layer 42 is formed by a SiON layer or a $Si_3N_4$ layer.

The first dielectric layer 43A is formed to an $Al_2O_3$ layer, which has a dielectric constant of 7, a perovskite structure and a covalent bonding. The second dielectric layer 43B is formed with a layer selected form a group consisting of a TaON layer, which a dielectric constant is 23 to 25, a $Ta_2O_5$ layer, which a dielectric constant is 25 to 27, and a BST layer, which a dielectric constant is 200 to 400.

The thickness of the first dielectric layer 43A is thinner than that of the second dielectric layer 44B. The first dielectric layer 43A is formed at a thickness of 10 Å to 20 Å and the second dielectric layer 43B is formed at a thickness of 50 Å to 100 Å.

The first electrode 41, which is a bottom electrode, and the second electrode 44, which is a top electrode, are formed with a silicon layer having at least a doped polysilicon layer or a doped amorphous silicon layer, a metal layer having at least TiN, TaN, W, WN, Ru, Ir or Pt or a silicide layer having at least CoSi, MoSi or WSi.

The $Al_2O_3$ layer, which is the first dielectric layer 43A, is a very stable crystallized layer having a perovskite structure and a covalent bonding. Since the $Al_2O_3$ layer plays the role of an oxygen diffusion barrier layer protecting from oxygen that atoms are diffused into a lower layer through the second dielectric layer 43B in a thermal treatment process of the second dielectric layer 43B so that a formation of a low-k dielectric oxide layer on a boundary of the first electrode 41 can be prevented. In addition, as a nitride layer is formed according to the second embodiment of the present invention, formation of the low-k dielectric oxide layer is prevented.

As the second dielectric layer having a high dielectric constant and the first dielectric layer to prevent a formation of a low-k dielectric oxide layer are formed according to the present invention, a thickness of an effective oxide layer (Tox) can be controlled to be under 30 Å and a desired capacitance and excellent current leakage characteristics are obtained.

Figure 7:
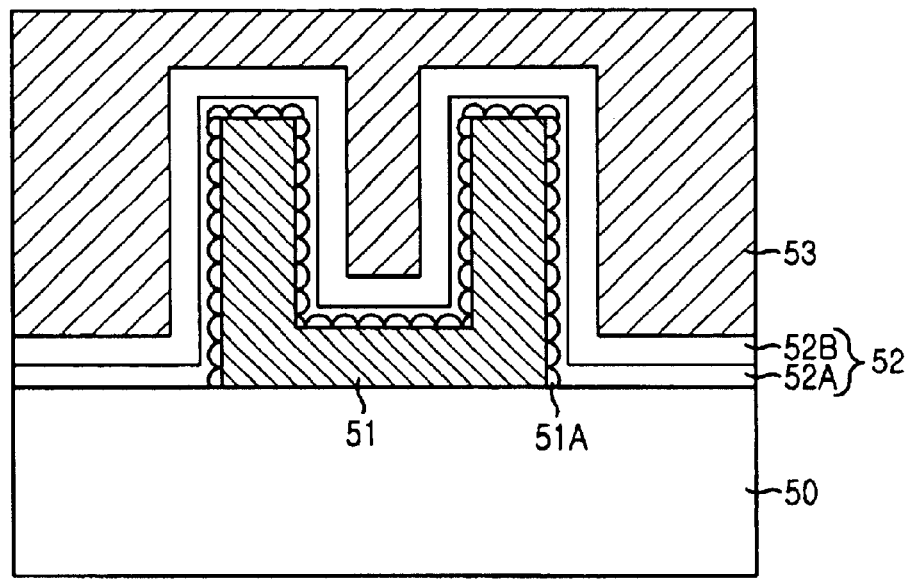
FIG. 7 is a cross-sectional view showing a cylinder-type capacitor having a stacked $Al_2O_3$/TaON layer in the semiconductor device according to the present invention.

FIG. 7 is a cross-sectional view showing an example of a cylinder-type capacitor according to a third embodiment of the present invention.

Referring to FIG. 7, an interconnection layer 50 including a source/drain of a transistor and plug is formed. A cylinder-type first electrode 51 having unevenness 51A is formed on the interconnection layer 50. A dielectric layer 52, which is a stacked structure, is formed over the first electrode 51 and a second electrode 53 is formed on the dielectric layer 52. The dielectric layer 52 is formed to a stacked layer including a first dielectric layer 52A having a high mechanical strength and a second dielectric layer 52B having a high dielectric constant.

The first dielectric layer 52A is formed to an $Al_2O_3$ layer, which has a dielectric constant of 7, a perovskite structure and a covalent bonding. The second dielectric layer 32B is formed with a layer selected form a group consisting of a TaON layer, which has a dielectric constant of 23 to 25, a $Ta_2O_5$ layer, which has a dielectric constant of 25 to 27, and a BST layer, which has a dielectric constant of 200 to 400.

A thickness of the first dielectric layer 52A is thinner than that of the second dielectric layer 52B. The first dielectric layer 52A is formed at a thickness of 10 Å to 20 Å and the second dielectric layer 52B is formed at a thickness of 50 Å to 100 Å.

The first electrode 51, which is a bottom electrode, and the second electrode 53, which is a top electrode, are formed with a silicon layer having at least a doped polysilicon layer or a doped amorphous silicon layer, a metal layer having at least TiN, TaN, W, WN, Ru, Ir or Pt or a silicide layer having at least CoSi, MoSi or WSi.

When a TiN layer is formed as the second electrode 53, a doped polysilicon layer is deposited as a buffer layer to obtain a stability of a structure on the TiN layer to improve a resistance against thermal and electrical impacts.

The first electrode 51 can be formed to various 3-D structures based on a cylinder structure. As adding unevenness 51A, such as hemispherical grains, to the first electrode 51, a surface area increases so that a desired capacitance can be obtained.

Figure 8:
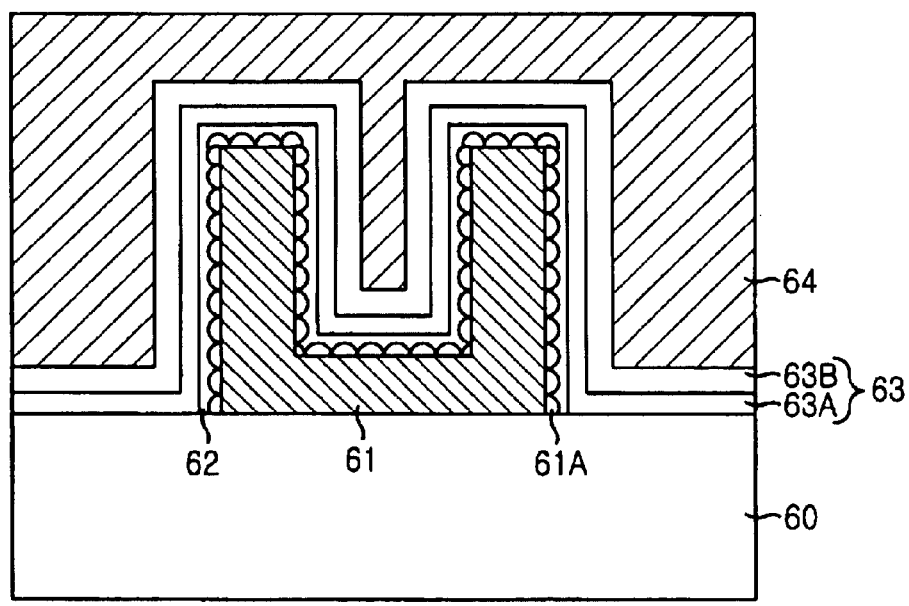
FIG. 8 is a cross-sectional view showing another cylinder-type capacitor having a stacked $Al_2O_3$/TaON layer in the semiconductor device according to the present invention.

FIG. 8 is a cross-sectional view showing another example according to the second embodiment of the present invention.

Referring to FIG. 8, an interconnection layer 60 including a source/drain of a transistor and plug is formed on a semiconductor substrate (not shown). A cylinder-type first electrode 61 having unevenness 61A is formed on the interconnection layer 60. A dielectric layer 63, which is a stacked structure, is formed over the first electrode 61 and a second electrode 64 is formed on the dielectric layer 63. The dielectric layer 63 is formed to a stacked layer including a first dielectric layer 63A having a high mechanical strength and a second dielectric layer 63B having a high dielectric constant. A nitride layer is formed by a nitridation process of a boundary between the first electrode 61 and the dielectric layer 63.

The nitride layer 62 prevents a formation of a native oxide layer on a surface of the first electrode 61 and plays a role of an oxygen diffusion barrier layer by minimizing a formation of a low-k dielectric oxide layer at a boundary between the first electrode 61 and the dielectric layer 63 in a deposition process of the dielectric layer 42.

The first dielectric layer 63A is formed to an $Al_2O_3$ layer, which has a dielectric constant of 7, a perovskite structure and a covalent bonding. The second dielectric layer 63B is formed with a layer selected form a group consisting of a TaON layer, which a dielectric constant is 23 to 25, a $Ta_2O_5$ layer, which a dielectric constant is 25 to 27, and a BST layer, which a dielectric constant is 200 to 400.

A thickness of the first dielectric layer 63A is thinner than that of the second dielectric layer 63B. The first dielectric layer 52A is formed at a thickness of 10 Å to 20 Å and the second dielectric layer 52B is formed at a thickness of 50 Å to 100 Å.

The first electrode 61, which is a bottom electrode, and the second electrode 64, which is a top electrode, are formed with a silicon layer having at least a doped polysilicon layer or a doped amorphous silicon layer, a metal layer having at least TiN, TaN, W, WN, Ru, Ir or Pt or a silicide layer having at least CoSi, MoSi or WSi.

When a TiN layer is formed as the second electrode 64, a doped polysilicon is deposited as a buffer layer to obtain a stability of a structure on the TiN layer to improve a resistance against thermal and electrical impacts.

The first electrode 61 can be formed to various 3-D structures based on a cylinder structure. As adding unevenness 61A, such as hemispherical grains, to the first electrode 61, a surface area increases so that a desired capacitance can be obtained.

The $Al_2O_3$ layer, which is the first dielectric layer 63A, is a stable crystallized layer having a perovskite structure and a covalent bonding. Since the $Al_2O_3$ layer plays role of an oxygen diffusion barrier layer protecting that oxygen atoms are diffused into a lower layer through the second dielectric layer 63B in a thermal treatment process of the second dielectric layer 63B so that a formation of a low-k dielectric oxide layer on a boundary of the first electrode 61 can be prevented. In addition, as a nitride layer is formed according to the second embodiment of the present invention, a formation of the low-k dielectric oxide layer is prevented.

Specially, as the nitride layer is formed between the first electrode 61 and the dielectric layer 63, a formation of low-k dielectric oxide layer due to an oxygen diffusion is prevented.

As the dielectric layer 63 is formed to a stacked layer including the first dielectric layer 63A to prevent a formation of a low-k dielectric oxide layer and the second dielectric layer 63B and a surface area of the first electrode 61 increases due to using unevenness 61A according to the third embodiment of the present invention, a capacitance of a capacitor is higher than that of the second embodiment of the present invention.

According to the third embodiment of the present invention, the cylinder-type capacitor is used. Also, a concave-type capacitor can be used to obtain the same effects.

Figure 9:
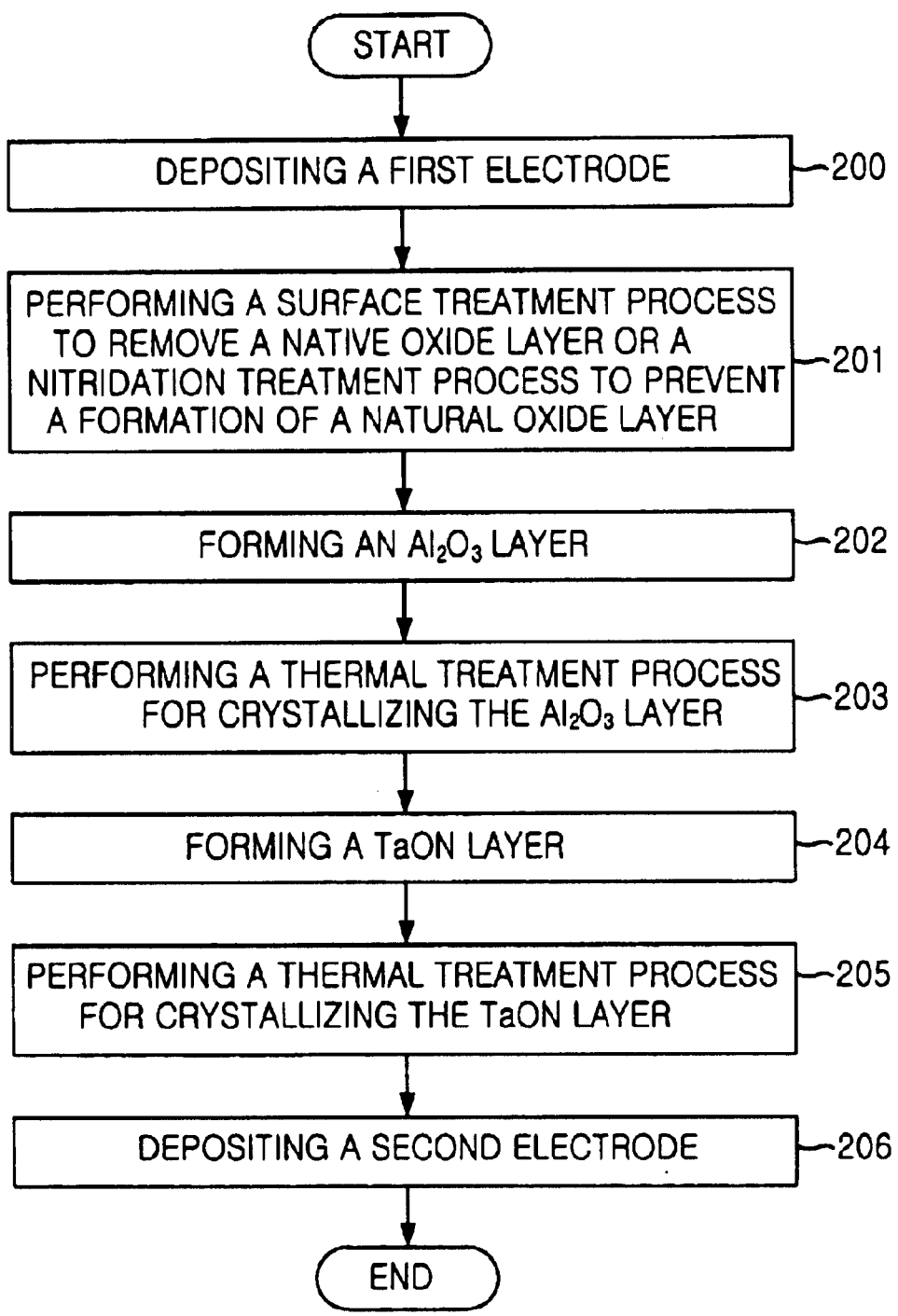
FIG. 9 is a flow chart showing a method for fabricating a capacitor according to the present invention.

FIG. 9 is a flow chart showing a procedure for fabricating a capacitor having a stacked layer, which is a $Al_2O_3$ layer and a TaON layer, according to the second and third embodiments of the present invention.

A doped polysilicon layer is used as the first and second electrodes. The $Al_2O_3$ layer is used as a first dielectric layer and the TaON layer is used as a second dielectric layer. A polysilicon layer having hemispherical grains (HSG) is formed on the surface of the first electrode.

After a doped polysilicon layer is deposited as the first electrode at a step 200, a surface treatment process of the surface of the polysilicon layer is carried out to remove a native oxide ($SiO_2$) layer or a nitridation process is carried out to minimize a formation of a low-k dielectric oxide layer generated in an $Al_2O_3$ deposition process at a step 201.

The surface treatment process is carried out in-situ or ex-situ by using a HF gas or a HF solution, and a boundary cleaning process is carried out before or after the HF surface treatment process. Also, a boundary treatment process can be carried out by using a $NH_4OH$ solution or a $H_2SO_4$ solution to improve a uniformity.

The nitridation process is carried out by discharging a plasma in-situ or ex-situ in an atmosphere of a $NH_3$ gas or a $N_2/H_2$ gas in a low pressure chemical vapor deposition (LPCVD) chamber. At this time, a temperature of a wafer is of about 300° C. to about 500° C.

Another nitridation process is carried out in-situ or ex-situ by using a rapid thermal process (RTP) at a temperature of about 750° C. to about 950° C. and at a $NH_3$ gas atmosphere for 30 seconds to 120 seconds. Also, the nitridation process can be carried out at an electro-furnace at a temperature of about 500° C. to about 100° C. and at a $NH_3$ gas atmosphere.

The $Al_2O_3$ layer is formed on the doped polysilicon layer, which the surface treatment process or the nitridation process is completed, as a dielectric layer of a capacitor at a step 202. $Al_2O_3$ is obtained by evaporating an $Al(OC_2H_5)_3$ solution, which is provided to a evaporator or a evaporation tube through a flow controller, such as a MFC or the like, at a temperature of about 150° C. to about 300° C. At this time, oxygen gas is added.

Before performing the $Al_2O_3$ layer deposition, a thermal treatment process is carried out to improve structural defects and structural non-homogeneity due to a dangling bond so that a current leakage characteristic is improved.

Before depositing the TaON layer, a thermal treatment process for crystallizing the $Al_2O_3$ layer is carried out at a temperature of about 800° C. to about 950° C. and in an atmosphere of a $N_2$ gas or a $N_2/O_2$ gas for 30 seconds to 120 seconds in a rapid thermal process device to play a role of a diffusion barrier layer protecting that oxygen atoms are diffused into the doped polysilicon layer during a highly thermal process at a step 203.

Another thermal treatment process for crystallizing the $Al_2O_3$ layer is carried out at an electro-furnace at a temperature of about 700° C. to about 800° C. and in an atmosphere of a $N_2$ gas or a $N_2/O_2$ gas for 10 minutes to 30 minutes.

The TaON layer is formed by a LPCVD technique or an atomic layer deposition (ALD) technique on the crystallized $Al_2O_3$ layer at a step 204 and a thermal treatment is carried out for crystallizing the TaON layer at a step 205.

When the TaON layer is formed by the LPCVD technique, a Ta bearing vapor gas and a reaction gas, which is a NH3 gas at a pressure of 10 sccm to 1000 sccm or a $O_2$ gas at a pressure of 0 sccm to 300 sccm, are injected through a MFC on a wafer in the low pressure chemical vapor deposition chamber maintained at a temperature of about 300° C. to about 600° C. and at a pressure of 0.1 torr to 5 torr and then the TaON layer is formed by a surface chemical reaction at a thickness of 50 Å to 100 Å. Subsequently, a thermal treatment process is carried out to crystallize the TaON layer at a step 205.

The Ta bearing vapor gas is generated by evaporating an organic metal compound having $Ta(OC_2H_5)_5$ or $Ta(N(CH_3)_2)_5$ of over 99.999% at a temperature of about 150° C. to about 200° C. injected through a flow controller, such as a MFC. In order to prevent a condensation of the vapor gas, the vapor is injected to a LPCVD chamber maintained at a temperature of about 150° C. to about 200° C. and at a pressure of 0.1 torr to 5 torr and then the TaON layer is deposited.

The thermal treatment process for crystallizing the amorphous TaON layer is carried out at a temperature of about 800° C. to about 950° C. and at a $N_20$ gas, a $N_2$ gas or a $N_2/O_2$ gas for 30 seconds to 120 seconds in the rapid thermal process device. At this time, impurities, such as CO, $CO_2$, $H_2O$, CH4, C2H4 or the like, remaining in the TaON layer are removed.

Also, another thermal treatment process for crystallizing the amorphous TaON layer can be carried out at a temperature of about 700° C. to about 800° C. and in an atmosphere of a $N_2O$ gas, a $N_2$ gas or a $N_2/O_2$ gas for 10 minutes to 30 minutes in an electro furnace.

The TaON layer and the $Al_2O_3$ layer are formed by the ALD technique instead of the LPCVD technique.

A doped polysilicon layer is deposited on the TaON layer as a top electrode at a step 206. The first and second electrodes are formed by a LPCVD technique, a plasma enhanced chemical vapor deposition technique or a RF-MS technique.

As mentioned the above, when the $Al_2O_3$/TaON capacitor is formed, thermal treatment processes of a low temperature, such as an in-situ or ex-situ $N_2$ or $O_2$ plasma thermal treatment process or an ex-situ UV-O3 thermal process, which are required in a deposition process of a $Ta_2O_5$ layer, are not needed.

An extra thermal treatment process to oxidize substitutional Ta atoms remaining in the layer is not required to protect a current leakage by stabilize an unstable stoichiometry of the $Ta_2O_5$ layer.

The $Al_2O_3$ layer has a perovskite structure of an excellent mechanical and electrical strength. Breakdown voltage of the TaON layer is higher than that of the $Ta_2O_5$ layer. In addition, since the TaON layer has a stable Ta—O—N structure, the TaON layer is strong against an external electrical impact.

When the stacked dielectric layer of the $Al_2O_3$/TaON layer is used, the breakdown voltage increases and a current leakage level decreases rather than one dielectric layer is used.

As the $Al_2O_3$ layer having an excellent diffusion barrier characteristic is formed before depositing the TaON layer, a formation of a low-k dielectric layer usually generated between the bottom electrode and the TaON layer can be prevented so that increase of a current leakage can be suppressed.

The present invention can be applied to semiconductor devices including a dielectric layer having a high dielectric constant of a stacked structure including the $Al_2O_3$/TaON ($Ta_2O_5$, BST) layer.

Accordingly, as the formation of a low-k dielectric layer between the bottom electrode and the dielectric layer is suppressed, a thickness of an effective oxide layer ($T_{ox}$) decreases compared with that of a NO layer, which Tox is of 45 Å to 55 Å and that of a $Ta_2O_5$ layer, which $T_{ox}$ is of 30 Å to 40 Å so that a sufficient capacitance can be obtained over 25 fF/cell even if a unit cell area is decreased due to a high integration of the semiconductor device.

While the present invention has been described with respect to the particular embodiments, it will be apparent to those skilled in the art that various changes and modifications may be made without departing from the spirit and scope of the invention as defined in the following claims.

What is claimed is:

1. A method for fabricating a semiconductor device comprising the steps of:
   a) providing a semiconductor substrate;
   b) forming a first gate electrode on the semiconductor substrate;
   c) forming an $Al_2O_3$ layer with a dielectric constant on the semiconductor substrate;
   d) forming a TaON layer with a high dielectric constant on the $Al_2O_3$ layer, said TaON layer dielectric constant being higher than said dielectric constant of the $Al_2O_3$ layer; and
   e) forming a second gate electrode on the TaON layer.

2. The method as recited in claim 1, further comprising the steps of performing a thermal treatment process of the $Al_2O_3$ and TaON layers after forming the $Al_2O_3$ and TaON layers.

3. The method as recited in claim 2, wherein the thermal process is carried out by a rapid thermal process at a temperature of about 800° C. to about 950° C. or by an electro-furnace process at a temperature of about 700° C. to about 800° C.

4. The method as recited in claim 1, further comprising a step of performing a surface treatment process to remove a native oxide layer on a surface of the first gate electrode after forming the first electrode.

5. The method as recited in claim 4, wherein the surface treatment process is carried out by using a HF gas or a HF solution.

6. The method as recited in claim 5, further comprising a step of performing a boundary treatment process by using a $NH_4OH$ solution or a $H_2SO_4$ solution before or after the surface treatment process.

7. The method as recited in claim 1, further comprising a step of performing a nitride treatment process of a surface of the first gate electrode to in-situ or ex-situ.

8. The method as recited in claim 7, wherein the nitride treatment process is carried out in an atmosphere of a $NH_3$ gas or a $N_2/H_2$ gas and at a temperature of about 300° C. to about 500° C.

9. The method as recited in claim 7, wherein the nitride treatment process is carried out by a rapid thermal process at a temperature of about 750° C. to about 950° C. and in an atmosphere of a $NH_3$ gas for 30 seconds to 120 seconds.

10. The method as recited in claim 7, wherein the nitride treatment process is carried out by an electro-furnace process at a temperature of about 500° C. to about 1000° C. and in an atmosphere of a $NH_3$ gas.

11. The method as recited in claim 1, wherein the step c) is carried out by a low pressure chemical vapor deposition process or a atomic layer deposition process.

12. The method as recited in claim 11, wherein the low pressure chemical vapor deposition process of the $Al_2O_3$ layer is carried out by evaporation of an $Al(OC_2H5)_3$ solution adding oxygen, in which a chemical vapor having aluminum is provided to an evaporator or an evaporating tube through a flow controller, at a temperature of about 150° C. to about 300° C.

13. The method as recited in claim 1, wherein the step d) is carried out by a low pressure chemical vapor deposition (LPCVD) process or an atomic layer deposition (ALD) process.

14. The method as recited in claim 13, wherein a Ta bearing vapor gas and a reaction gas, which is a $NH_3$ gas at a pressure of 10 sccm to 1000 sccm or a $O_2$ gas at a pressure of 0 sccm to 300 sccm, are injected through a mass flow controller (MFC) onto a wafer in the low pressure chemical vapor deposition chamber maintained at a temperature of about 300° C. to about 600° C. and at a pressure of 0.1 torr to 5 torr and then the TaON layer is formed by a surface chemical reaction.

15. The method as recited in claim 14, wherein the Ta bearing vapor gas is generated by evaporating an organic metal compound having $Ta(OC_2H_5)_5$ or $Ta(N(CH_3)_2)_5$ of over 99.999% at a temperature of about 150° C. to about 200° C. injected through a flow controller and, in order to prevent a condensation of the vapor gas, the Ta bearing vapor gas is injected into a LPCVD chamber maintained at a temperature of about 150° C. to about 200° C. and at a pressure of 0.1 torr to 5 torr.

* * * * *